(12) United States Patent  (10) Patent No.: US 7,760,048 B2
Shibahara et al.  (45) Date of Patent: Jul. 20, 2010

(54) ELASTIC WAVE FILTER AND COMMUNICATION DEVICE EQUIPPED WITH THE ELASTIC WAVE FILTER

(75) Inventors: Teruhisa Shibahara, Kanazawa (JP); Masakazu Tani, Hakusan (JP); Yasuaki Shin, Hakusan (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 913 days.

(21) Appl. No.: 10/561,341

(22) PCT Filed: Apr. 4, 2005

(86) PCT No.: PCT/JP2005/006609
§ 371 (c)(1),
(2), (4) Date: Dec. 19, 2005

(87) PCT Pub. No.: WO2005/104363
PCT Pub. Date: Nov. 3, 2005

(65) Prior Publication Data
US 2008/0309433 A1    Dec. 18, 2008

(30) Foreign Application Priority Data
Apr. 19, 2004  (JP)  .............................. 2004-122925

(51) Int. Cl.
*H03H 9/64* (2006.01)
*H03H 9/72* (2006.01)
(52) U.S. Cl. ...................................... 333/193; 333/133
(58) Field of Classification Search .................. 333/133, 333/187, 188, 189, 190, 191, 192, 193, 194, 333/195, 196
See application file for complete search history.

(56) References Cited

U.S. PATENT DOCUMENTS 6,583,691 B2 *  6/2003  Takamine ................... 333/195

(Continued)

FOREIGN PATENT DOCUMENTS

DE    198 18 826 A1    11/1999

(Continued)

OTHER PUBLICATIONS

Official Communication issued in corresponding Korean Patent Application No. 10-2005-7020761, dated Nov. 10, 2006.

(Continued)

*Primary Examiner*—Dean O Takaoka
(74) *Attorney, Agent, or Firm*—Keating & Bennett, LLP

(57) ABSTRACT

An elastic wave filter includes two longitudinally coupled resonator type elastic wave filter elements that are cascade connected with each other, each longitudinally coupled resonator type elastic wave filter element including three IDTs (interdigital transducers) arranged on a piezoelectric substrate in a transmitting direction of an elastic wave. In at least one of the longitudinally coupled resonator type elastic wave filter elements, electrode fingers of the IDTs that are cascade connected are arranged at a pitch that is smaller than a pitch of electrode fingers of the remaining IDT. The adverse effect of a parasitic capacitance in cascade connected wires disposed between the longitudinally coupled resonator type elastic wave filter elements is reduced so as to improve impedance matching of a cascade connected portion and to improve the VSWR characteristics of input-output terminals of the elastic wave filter.

10 Claims, 4 Drawing Sheets

U.S. PATENT DOCUMENTS

| | | |
|---|---|---|
| 6,674,345 B2 | 1/2004 | Nakamura et al. |
| 6,781,478 B2 * | 8/2004 | Takamine et al. ........... 333/133 |
| 6,809,614 B2 | 10/2004 | Fuji et al. |
| 6,853,269 B2 | 2/2005 | Nakamura et al. |
| 7,245,193 B2 * | 7/2007 | Funasaka .................... 333/193 |
| 2001/0043024 A1 | 11/2001 | Takamine et al. |
| 2002/0190815 A1 | 12/2002 | Takamine |
| 2003/0030511 A1 | 2/2003 | Nakamura et al. |
| 2003/0117239 A1 | 6/2003 | Fujii et al. |
| 2004/0095207 A1 | 5/2004 | Nakamura et al. |
| 2004/0124740 A1 | 7/2004 | Takamine et al. |

FOREIGN PATENT DOCUMENTS

| | | |
|---|---|---|
| JP | 7-212174 A | 8/1995 |
| JP | 9-321567 A | 12/1997 |
| JP | 2000-91881 | 3/2000 |
| JP | 2001-217680 | 8/2001 |
| JP | 2002-009587 | 1/2002 |
| JP | 2002-084165 | 3/2002 |
| JP | 2003-92527 | 3/2003 |
| JP | 2003-258603 | 9/2003 |

OTHER PUBLICATIONS

Official communication issued in counterpart Chinese Application No. 200580000220.3, mailed on May 16, 2008.

International Search Report for PCT Application No. PCT/JP2005/006609; mailed Jul. 19, 2005.

Official communication issued in counterpart European Application No. 05728857.3, mailed on Mar. 23, 2009.

* cited by examiner

ELASTIC WAVE FILTER AND COMMUNICATION DEVICE EQUIPPED WITH THE ELASTIC WAVE FILTER

BACKGROUND OF THE INVENTION

1. Field of the Invention

The present invention relates to elastic wave filters and communication devices equipped with such elastic wave filters. In particular, the present invention relates to an elastic wave filter that applies elastic waves, such as a surface acoustic wave filter and an elastic boundary wave filter, and also relates to a communication device equipped with such an elastic wave filter.

2. Description of the Related Art

As an example of a bandpass filter having passband frequency ranging from several tens of MHz to several GHz, a surface acoustic wave filter is known. Due to having a compact, lightweight structure, surface acoustic wave filters have been used in portable communication devices in recent years.

Although there are various types of surface acoustic wave filters, the type commonly used in a front end of a portable communication device is a longitudinally coupled resonator type surface acoustic wave filter having two reflectors arranged on a piezoelectric substrate in a transmitting direction of a surface acoustic wave and also having input IDTs (interdigital transducers) and output IDTs arranged alternately between the two reflectors. The longitudinally coupled resonator type surface acoustic wave filter is characterized in that the insertion loss in the frequency within a band is small and that the conversion between balanced signals and unbalanced signals can be achieved readily.

The principle of operation in the longitudinally coupled resonator type surface acoustic wave filter is as follows.

An input electric signal is converted to a surface acoustic wave by the input IDTs so that a standing wave of the surface acoustic wave is generated between the two reflectors. The energy of the generated standing wave is converted to an electric signal by the output IDTs so that an output signal is generated. In this case, the conversion efficiency between the electric signal and the surface acoustic wave in the input IDTs and the output IDTs has a frequency characteristic, and moreover, the surface acoustic wave reflection efficiency of the reflectors also has a frequency characteristic. Thus, the longitudinally coupled resonator type surface acoustic wave filter has a bandpass characteristic that only transmits signals that are within a certain frequency range.

In order to increase the amount of signal attenuation outside the passband, a surface acoustic wave filter is used which has two or more longitudinally coupled resonator type surface acoustic wave filter elements that are cascade connected to each other on a piezoelectric substrate. By cascade connecting multiple longitudinally coupled resonator type surface acoustic wave filter elements, the signals outside the passband are sequentially attenuated by the corresponding longitudinally coupled resonator type surface acoustic wave filter element, whereby the amount of signal attenuation outside the passband is increased (see, for example, Japanese Unexamined Patent Application Publication No. 2002-9587).

FIG. 1 illustrates a surface acoustic wave filter 150 having two longitudinally coupled resonator type surface acoustic wave filter elements 106, 112 disposed on a piezoelectric substrate 100 and cascade connected to each other.

The longitudinally coupled resonator type surface acoustic wave filter element 106 includes two reflectors 101, 105 between which three IDTs 102, 103, 104 are aligned in a transmitting direction of a surface acoustic wave. Similarly, the longitudinally coupled resonator type surface acoustic wave filter element 112 includes two reflectors 107, 111 between which three IDTs 108, 109, 110 are aligned in a transmitting direction of a surface acoustic wave. The reflectors 101, 105, 107, 111 are periodical gratings. The IDTs 102 to 104, 108 to 110 are interdigitating comb shaped electrodes.

The IDT 102 and the IDT 108 are connected to each other via a wire 113, and the IDT 104 and the IDT 110 are connected to each other via a wire 114, whereby the longitudinally coupled resonator type surface acoustic wave filter elements 106, 112 are cascade connected to each other.

Wires 115 to 122 are provided as conductors between pads 123 to 130 (128 not included) and the IDTs 102 to 104, 108 to 110. The pads 123 to 127 function as grounding pads that are grounded. On the other hand, the pad 129 functions as an input pad to which an input voltage is applied. The pad 130 functions as an output pad in which an output voltage is generated.

The reflectors 101, 105, 107, 111; the IDTs 102 to 104, 108 to 110; the wires 113 to 122; and the pads 123 to 130 (128 not included) together define a metallic film pattern provided on the piezoelectric substrate 100. For example, the metallic film pattern is produced by a thin film micromachining process, which may be a vacuum film forming process, a photolithography process, an etching process, or a lift off process.

FIG. 2 illustrates a surface acoustic wave filter 250 which is provided with a function for conversion between an unbalanced signal and a balanced signal and has two longitudinally coupled resonator type surface acoustic wave filter elements 206, 212 disposed on a piezoelectric substrate 200 and cascade connected to each other. Since the surface acoustic wave filter 250 and the surface acoustic wave filter 150 share many common features, the differences from the surface acoustic wave filter 150 will be mainly described below. Therefore, description of the reflectors 201, 205, 207, 211; IDT 203; and wires 215-221 will be omitted below.

An IDT 209 is divided into two IDT segments. The IDT 209 generates a balanced signal. Pads 223 to 227 are grounded. When an unbalanced input signal is input to a pad 229, balanced output signals are generated in a pad 230 and a pad 231.

In the surface acoustic wave filter 250, the polarities of an IDT 202 and an IDT 204 are inverted, and the polarities of an IDT 208 and an IDT 210 are also inverted. Thus, a connection wire 213 and a connection wire 214 transmit reversed phase signals. This technique is effective for improving the degree of balance of the balanced output signals of the surface acoustic wave filter 250. Alternatively, the function for conversion between an unbalanced signal and a balanced signal in the surface acoustic wave filter 250 can be sufficiently achieved without using this technique. In that case, the IDT 202 and the IDT 204 are given the same polarity and the IDT 208 and the IDT 210 are also given the same polarity so that the connection wire 213 and the connection wire 214 transmit in-phase signals. However, using the above mentioned technique is advantageous in that the degree of balance of the balanced output signals is improved.

Examples of surface acoustic wave filters have just been described above. As a similar filter, an elastic boundary wave filter is known. Similar to surface acoustic wave filters, an elastic boundary wave filter includes reflectors and IDTs made of a metallic film disposed on a piezoelectric substrate. For example, the elastic boundary wave filter has filter electrodes including IDTs and reflectors made of, for example, Al on a surface of a piezoelectric single crystal plate, and a film having a sufficient thickness and made of, for example, $SiO_2$ on the filter electrodes. The film has an elastic constant or density that is different from that of the piezoelectric single crystal. Although the operation and the structure are substantially the same as those of surface acoustic wave filters, the elastic boundary wave filter additionally has a solid layer disposed over the surface of the piezoelectric substrate. The elastic boundary wave filter operates based on interaction between the IDTs and an elastic wave (elastic boundary wave) transmitted through the boundary between the piezoelectric substrate and the solid layer. In contrast to the surface acoustic wave filter which requires a package having a cavity to prevent the surface of the substrate from being restrained, the elastic boundary wave filter is advantageous in that it does not require such a package having a cavity since the wave is transmitted through the boundary plane between the piezoelectric single crystal substrate and the film.

In short, a surface acoustic wave filter operates based on a transmission of a surface acoustic wave through a surface of a piezoelectric substrate, whereas an elastic boundary wave filter operates based on a transmission of an elastic boundary wave through a boundary between a piezoelectric substrate and a solid layer. The principle of operation of the two is basically the same, and the design approach of the two is similar.

In the specification of the present invention, the term "elastic wave filter" will be used as a generic term to refer to a filter, such as the surface acoustic wave filter and the elastic boundary wave filter, which applies an elastic wave (e.g. Rayleigh wave, SH wave, pseudo surface acoustic wave, Love wave, Sezawa wave, Stonely wave, boundary wave). Furthermore, the term "longitudinally coupled resonator type elastic wave filter" will be used as a generic term to refer to a longitudinally coupled resonator type surface acoustic wave filter and a longitudinally coupled resonator type elastic boundary wave filter.

High frequency bandpass filters like the elastic wave filters require good impedance matching. A filter having bad impedance matching in the input-output terminals, that is, a filter having large signal reflection in the input-output terminals, is subject to bad (large) insertion loss since the signals are lost due to reflection. Moreover, the signals reflected in the input-output terminals of the filter re-enter other electronic components connected to the filter, which could lead to failures, such as a transmission error of a circuit.

The terms "good impedance matching", "small signal reflection", and "small VSWR (voltage standing wave ratio)" are all used synonymously with one another. If the impedance matching is good, the signal reflection is smaller and the VSWR is also smaller. A small VSWR implies that the signal reflection is small, which means that the impedance matching is good.

In an elastic wave filter having a plurality of cascade connected longitudinally coupled resonator type elastic wave filter elements disposed on a piezoelectric substrate, the impedance matching in the cascade connected portion between the longitudinally coupled resonator type elastic wave filter elements affects the impedance matching of the entire elastic wave filter. Specifically, if the impedance matching in the cascade connected portion between the longitudinally coupled resonator type elastic wave filter elements is bad, and if signal reflection occurs in this cascade connected portion, the reflected signal is released outward from the filter as a reflection wave of the elastic wave filter.

Concerning the cascade connected portion between the longitudinally coupled resonator type elastic wave filter elements, the impedance of one of the longitudinally coupled resonator type elastic wave filter elements with respect to the cascade connected portion and the impedance of the other longitudinally coupled resonator type elastic wave filter element with respect to the cascade connected portion ideally have a complex conjugate relationship. If the two have a complex conjugate relationship, the impedance matching in the cascade connected portion is complete, meaning that signal reflection in this portion will not occur at all.

However, under present circumstances, the impedances of the longitudinally coupled resonator type elastic wave filter elements with respect to the cascade connected portion tend to become capacitive (i.e. the imaginary impedances become negative) due to the parasitic capacitance between cascade connected wires and a grounding pattern, meaning that an ideal complex conjugate state (in which one of the imaginary impedances is positive and the other imaginary impedance is negative) is difficult to attain. This is the factor that increases the signal reflection in the cascade connected portion between the longitudinally coupled resonator type elastic wave filter elements. As a result, the VSWR characteristic of an elastic wave filter having cascaded connected longitudinally coupled resonator type elastic wave filter elements is deteriorated. This problem is more noticeable in a case where the piezoelectric substrate has a large relative dielectric constant since the parasitic capacitance between the cascade connected wires and the grounding pattern increases in proportion to the relative dielectric constant. Moreover, this problem becomes more noticeable as the frequency within the passband of the filter becomes higher since the current flowing into the parasitic capacitance increases in proportion to the frequency within the passband.

SUMMARY OF THE INVENTION

To overcome the problems described above, preferred embodiments of the present invention provide an elastic wave filter having a plurality of cascade connected longitudinally coupled resonator type elastic wave filter elements disposed on a piezoelectric substrate, in which an adverse effect of a parasitic capacitance in cascade connected wires disposed between the longitudinally coupled resonator type elastic wave filter elements is reduced so as to improve impedance matching of a cascade connected portion and to improve the VSWR characteristics of input-output terminals of the elastic wave filter.

In order to overcome the aforementioned problems, a preferred embodiment of the present invention provides an elastic wave filter having the following structure.

An elastic wave filter preferably includes two longitudinally coupled resonator type elastic wave filter elements that are cascade connected with each other, each longitudinally coupled resonator type elastic wave filter element including three IDTs arranged on a piezoelectric substrate in a transmitting direction of an elastic wave. In at least one of the longitudinally coupled resonator type elastic wave filter elements, electrode fingers of one or two of the IDTs that are cascade connected are arranged at a pitch that is smaller than a pitch of the electrode fingers of the remaining IDT(s) such that a frequency of a conductance peak in one or two of the cascade connected IDTs is higher than a frequency of a conductance peak in the remaining IDT(s).

According to the structure described above, in each of the longitudinally coupled resonator type elastic wave filter elements, the cascade connected IDT(s) generally have the remaining IDT(s) disposed therebetween. The remaining IDT(s) not cascade connected define an input terminal or an output terminal of the elastic wave filter. Conventionally, the electrode fingers were arranged at the same pitch for all IDTs.

In contrast, in this preferred embodiment of the present invention, the electrode fingers of one or two of the cascade connected IDTs are arranged at a pitch that is smaller than the pitch of the electrode fingers of the remaining IDT(s). Since this reduces the impedance of the cascade connected IDT(s) (more specifically, the real impedance becomes smaller), the real impedance of the cascade connected IDT(s) becomes smaller. Accordingly, the cascade connected portion changes from a high-voltage low-current transmission system to a low-voltage high-current transmission system.

In comparison with a transmission system having a large real impedance, specifically, a high-voltage low-current transmission system, a transmission system having a small real impedance, specifically, a low-voltage high-current transmission system, is less affected by parasitic capacitance. This is due to the following reasons. Specifically, since the transmission system is a low-voltage transmission system, a lower voltage is applied to the parasitic capacitance whereby the current flowing into the parasitic capacitance is reduced. In addition, since the transmission system is a high-current transmission system, even if the same amount of current flows into the parasitic capacitance, the effect of the parasitic capacitance is still reduced since the transmitted current itself increases.

Accordingly, the effect of the parasitic capacitance in the cascade connected portion is reduced, whereby the mismatch of the impedance caused by the effect is reduced. As a result, this reduces the signal reflection in the cascade connected portion whereby the VSWR characteristic of the elastic wave filter is improved.

Furthermore, in each of the longitudinally coupled resonator type elastic wave filter elements, electrode fingers of one or two of the IDTs that are cascade connected are preferably arranged at a pitch that is smaller than a pitch of electrode fingers of the remaining IDT(s).

By reducing the impedance of all of the cascade connected IDTs, the VSWR characteristic of the elastic wave filter can be further improved.

Specifically, this may be achieved by the following structure, for example.

A relative dielectric constant of the piezoelectric substrate is preferably about 30 or more.

In a piezoelectric substrate whose relative dielectric constant is about 30 or more, the parasitic capacitance is increased thereby achieving an outstanding improvement in the VSWR characteristic.

Furthermore, a center frequency of a passband is preferably about 500 MHz or more.

In a filter whose center frequency of a passband is about 500 MHz or more, an improvement in the VSWR characteristic is outstanding.

Furthermore, the IDTs are preferably aligned in a transmitting direction of a surface acoustic wave.

In this case, the elastic wave filter is a surface acoustic wave filter that utilizes a surface acoustic wave transmitted through the surface of the piezoelectric substrate.

Furthermore, the elastic wave filter may further include a thin film which is disposed on the piezoelectric substrate and has an elastic constant or a density that is different from that of the piezoelectric substrate. Moreover, the IDTs are preferably aligned in a transmitting direction of an elastic boundary wave between the piezoelectric substrate and the thin film.

In this case, the elastic wave filter is an elastic boundary wave filter that utilizes an elastic boundary wave transmitted through a boundary between the piezoelectric substrate and a thin film defining a solid layer.

Furthermore, a preferred embodiment of the present invention provides a communication device equipped with the elastic wave filter having the unique structure described above.

According to an elastic wave filter of the present invention, the VSWR characteristics in input-output terminals are improved. Furthermore, a communication device according to another preferred embodiment of the present invention is provided with the elastic wave filter having improved VSWR characteristics so that the features of the device are improved.

Other features, elements, steps, advantages and characteristics of the present invention will become more apparent from the following detailed description of preferred embodiments thereof with reference to the attached drawings.

DETAILED DESCRIPTION OF PREFERRED EMBODIMENTS

Preferred embodiments of the present invention will now be described with reference to FIGS. 3 and 4.

Figure 3:
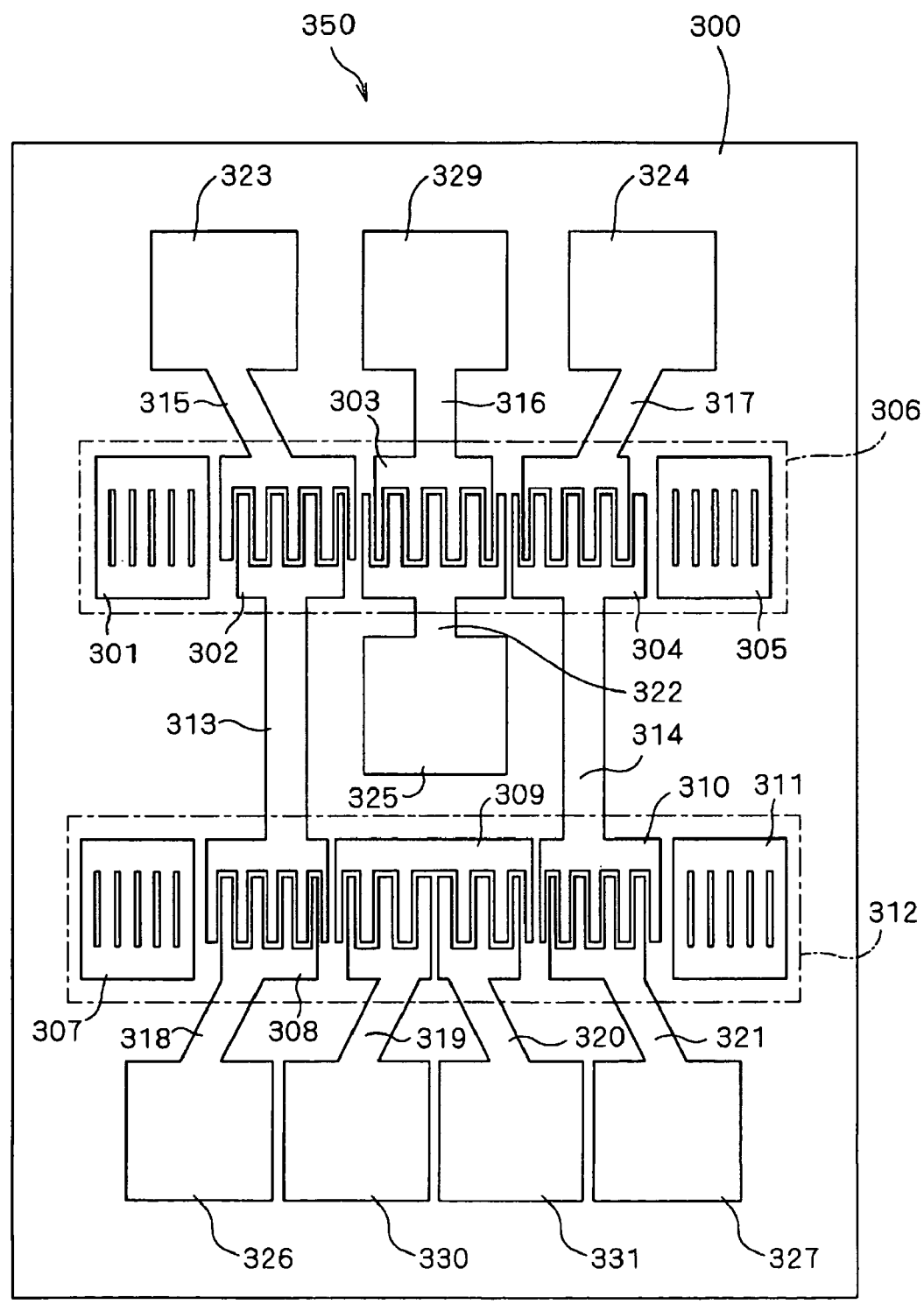
FIG. 3 is a schematic diagram of a surface acoustic wave filter according to a preferred embodiment of the present invention.

FIG. 3 illustrates a surface acoustic wave filter 350 according to a preferred embodiment of the present invention, which is provided with a function for conversion between an unbalanced signal and a balanced signal. Specifically, FIG. 3 is a schematic diagram in which the number of reflecting electrodes and electrode fingers shown is less than the actual quantity. However, the polarity relationships between adjacent reflectors and IDTs are accurately illustrated.

Figure 1:
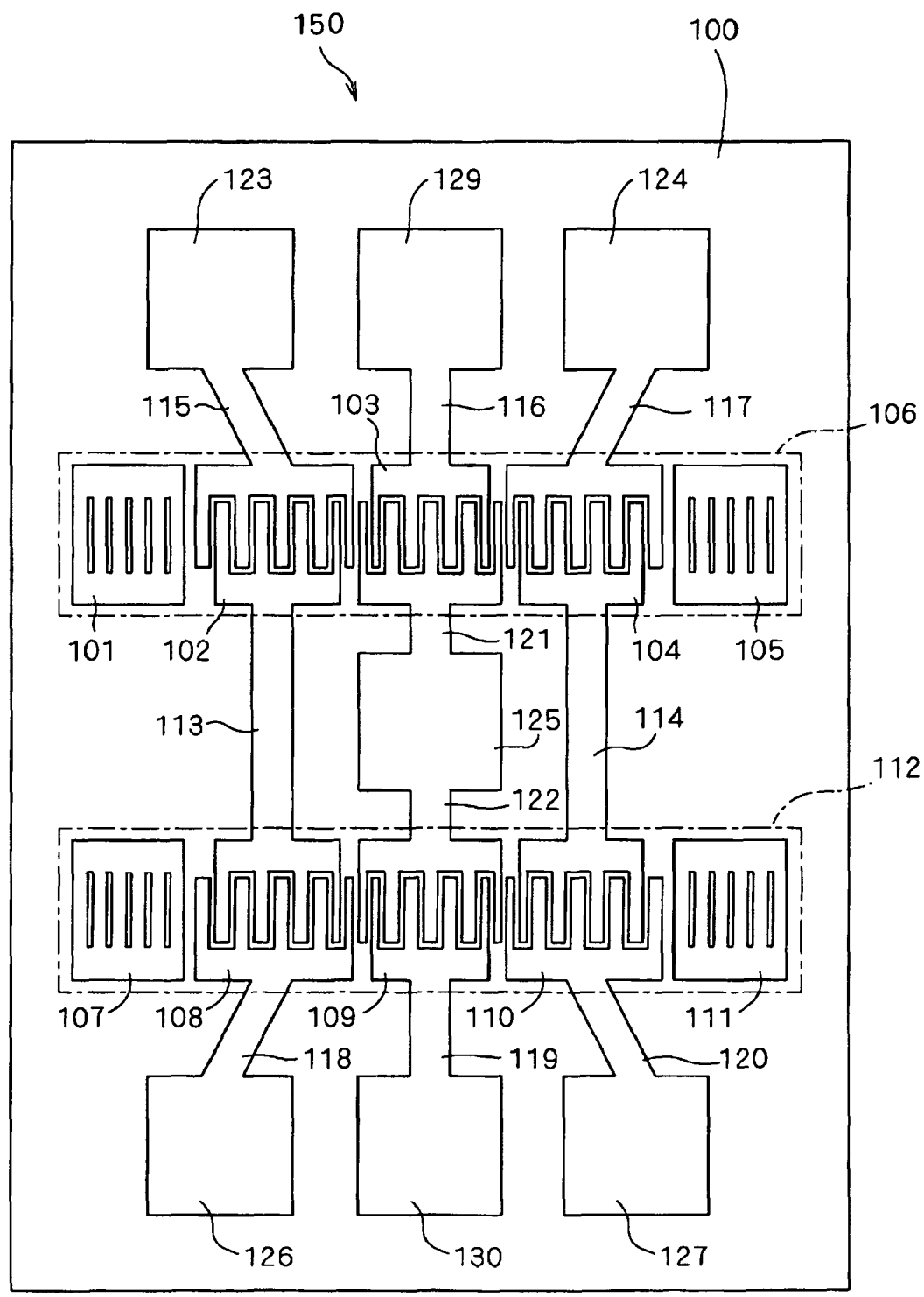
FIG. 1 is a schematic diagram of a surface acoustic wave filter according to a conventional example.
Figure 2:
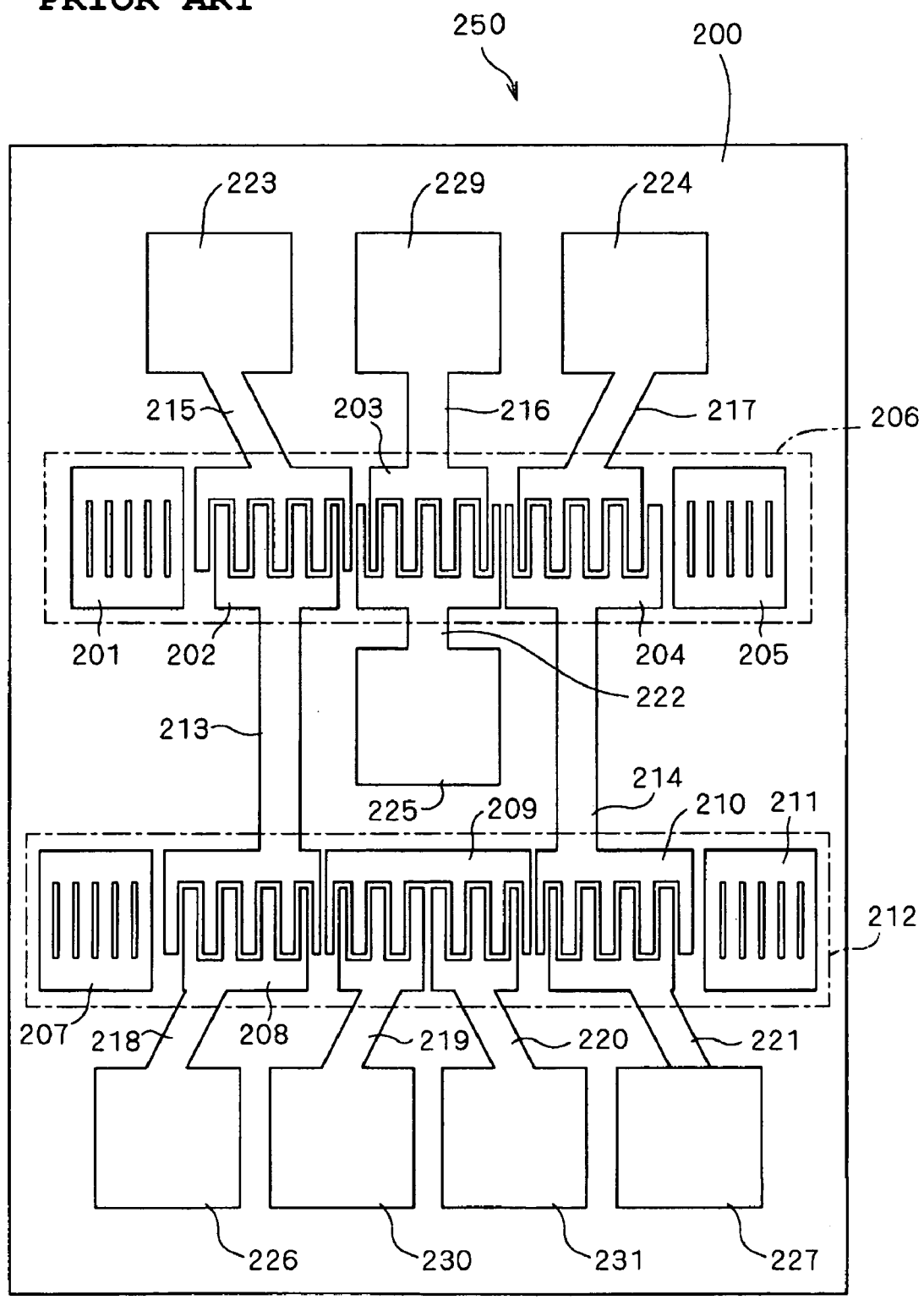
FIG. 2 is a schematic diagram of a surface acoustic wave filter according to another conventional example.

The surface acoustic wave filter 350 preferably has substantially the same structure as the surface acoustic wave filter 250 shown in FIG. 2 as a conventional example, and has basically the same principle of operation, except for the notable differences described below.

In other words, the surface acoustic wave filter 350 includes a piezoelectric substrate 300 on which two longitudinally coupled resonator type surface acoustic wave filter elements 306, 312, wires 313 to 321, and pads 323 to 331 (328 not included) are provided.

The longitudinally coupled resonator type surface acoustic wave filter element 306 includes two reflectors 301, 305 between which three IDTs 302, 303, 304 are aligned in a transmitting direction of a surface acoustic wave. On the other hand, the longitudinally coupled resonator type surface acoustic wave filter element 312 includes two reflectors 307, 311 between which three IDTs 308, 309, 310 are aligned in a transmitting direction of a surface acoustic wave.

Opposite ends of the IDT 303 disposed in the midsection of the longitudinally coupled resonator type surface acoustic wave filter element 306 are respectively connected to the pads 329, 325 via wires 316, 322. On the other hand, the IDT 309 disposed in the midsection of the longitudinally coupled resonator type surface acoustic wave filter element 312 has two opposing interdigital electrodes, one of which is divided into two segments. The two segments are respectively connected to the pads 330, 331 via the wires 319, 320.

First ends of the IDTs 302, 304 disposed on opposite sides of the longitudinally coupled resonator type surface acoustic wave filter element 306 are respectively connected to first ends of the IDTs 308, 310 disposed on opposite sides of the longitudinally coupled resonator type surface acoustic wave filter element 312 via the wires 313, 314. Thus, the longitudinally coupled resonator type surface acoustic wave filter elements 306, 312 are cascade connected to each other. Second ends of the IDTs 302, 304 disposed on opposite sides of the longitudinally coupled resonator type surface acoustic wave filter element 306 are respectively connected to the pads 323, 324 via the wires 315, 317, and second ends of the IDTs 308, 310 disposed on opposite sides of the longitudinally coupled resonator type surface acoustic wave filter element 312 are respectively connected to the pads 326, 327 via the wires 318, 321. The polarities of the IDT 302 and the IDT 304 are inverted. Moreover, the polarities of the IDT 308 and the IDT 310 are inverted.

When an unbalanced input signal is input to the pad 329 in a state where the pads 323 to 327 are grounded, balanced output signals are generated in the pads 330, 331.

The differences from the surface acoustic wave filter 250 shown in FIG. 2 will be described below.

In the longitudinally coupled resonator type surface acoustic wave filter element 306 of the surface acoustic wave filter 350, the electrode fingers of the IDTs 302, 304 are arranged at a pitch that is narrower than the pitch of electrode fingers of the IDT 303. Similarly, in the longitudinally coupled resonator type surface acoustic wave filter element 312, the electrode fingers of the IDTs 308, 310 are arranged at a pitch that is narrower than the pitch of electrode fingers of the IDT 309.

By setting the electrode fingers at a narrower pitch, the impedance of the cascade connected portion is reduced. This increases the current flowing through the cascade connected wires and decreases the voltage of the cascade connected wires, thereby reducing the effect of the parasitic capacitance in the cascade connected wires. As a result, impedance mismatching in the cascade connected portion is reduced, thereby improving the VSWR characteristics of the surface acoustic wave filter 350.

The surface acoustic wave filter 350 may be suitably used in, for example, a portable communication device as a band-pass filter whose center frequency of a passband is preferably about 500 MHz or more, for example.

Specific examples of the preferred embodiments of the present invention including examples of design parameters of the surface acoustic wave filter 350 will be described below. However, these specific examples of preferred embodiments of the present invention are in no way limiting of the present invention.

The piezoelectric substrate 300 is a LiTaO₃ single crystal plate of a 36° Y-cut X-surface wave transmission type. The piezoelectric substrate 300 is not limited to 36°, and may alternatively be a LiTaO₃ single crystal plate with a cut angle of 34° to 44°, for example. The two longitudinally coupled resonator type surface acoustic wave filter elements 306, 312 are preferably made using an aluminum film pattern having a thickness of 349 nm, for example.

The design parameters of the longitudinally coupled resonator type surface acoustic wave filter element 306 are as follows.

The crossover width is 135 µm. Each of the reflectors 301, 305 includes gratings arranged at a pitch of 2.128 µm and having a metallization ratio of 0.687. The number of gratings provided in each of the reflectors 301, 305 is 60. On the other hand, each of the IDTs 302, 304 includes electrode fingers arranged at a pitch of 2.108 µm and having a metallization ratio of 0.687. The number of electrode fingers provided in each of the IDTs 302, 304 is 27. However, in each of the IDT 302 and the IDT 304, four of the electrode fingers that are adjacent to the IDT 303 are arranged at a pitch of 1.941 µm and have a metallization ratio of 0.687. The IDT 303 includes electrode fingers arranged at a pitch of 2.117 µm and having a metallization ratio of 0.684. The number of electrode fingers provided in the IDT 303 is 36. However, four of the electrode fingers disposed on each side of the IDT 303 are arranged at a pitch of 1.941 µm and have a metallization ratio of 0.687. The reflector 301 and the IDT 302 are separated from each other by a distance of 2.085 µm (i.e. the distance between the centers of electrode fingers). Similarly, the reflector 305 and the IDT 304 are separated from each other by a distance of 2.085 µm (i.e. the distance between the centers of electrode fingers). Furthermore, the IDT 302 and the IDT 303 are separated from each other by a distance of 1.940 µm (i.e. the distance between the centers of electrode fingers). Similarly, the IDT 304 and the IDT 303 are separated from each other by a distance of 1.940 µm (i.e. the distance between the centers of electrode fingers). The frequency of the conductance peak in each of the IDTs 302, 304 is higher than the frequency of the conductance peak in the IDT 303.

The design parameters of the longitudinally coupled resonator type surface acoustic wave filter element 312 are as follows.

The crossover width is 135 µm. Each of the reflectors 307, 311 includes gratings arranged at a pitch of 2.128 µm and having a metallization ratio of 0.687. The number of gratings provided in each of the reflectors 307, 311 is 60. On the other hand, each of the IDTs 308, 310 includes electrode fingers arranged at a pitch of 2.108 and having a metallization ratio of 0.687. The number of electrode fingers provided in each of the IDTs 308, 310 is 27. However, in each of the IDT 308 and the IDT 310, four of the electrode fingers that are adjacent to the IDT 309 are arranged at a pitch of 1.957 µm and have a metallization ratio of 0.682. The IDT 309 includes electrode fingers arranged at a pitch of 2.117 µm and having a metallization ratio of 0.684. The number of electrode fingers provided in the IDT 309 is 40. However, five of the electrode fingers disposed on each side of the IDT 309 are arranged at a pitch of 1.941 µm and have a metallization ratio of 0.687. The reflector 307 and the IDT 308 are separated from each other by a distance of 2.085 µm (i.e. the distance between the centers of electrode fingers). Similarly, the reflector 311 and the IDT 310 are separated from each other by a distance of 2.085 µm (i.e. the distance between the centers of electrode fingers). Furthermore, the IDT 308 and the IDT 309 are separated from each other by a distance of 1.940 µm (i.e. the distance between the centers of electrode fingers). Similarly, the IDT 310 and the IDT 309 are separated from each other by a distance of 1.940 µm (i.e. the distance between the centers of electrode fingers). The frequency of the conductance peak in each of the IDTs 308, 310 is higher than the frequency of the conductance peak in the IDT 309.

The pitches of the electrode fingers in the cascade connected IDTs 302, 304; 308, 310 may respectively be smaller than the pitches of the electrode fingers in the other IDTs 303; 309, which are connected with input-output terminals, by an appropriate ratio. Specifically, the pitches are smaller by a ratio preferably within a range of 0.995 to 0.850, for example. In order to improve the VSWR characteristics, the ratio may be 0.995 or lower. On the other hand, the ratio may be 0.850 or higher in order to prevent, for example, the characteristics of the surface acoustic wave filter from being adversely affected.

Figure 4A:
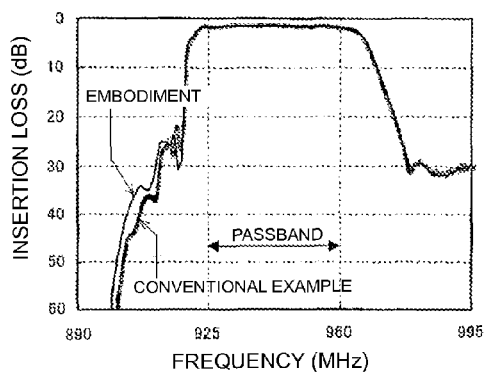
FIGS. 4A-4C include graphs illustrating the characteristics of the surface acoustic wave filters according to the preferred embodiments and according to the conventional examples.
Figure 4B:
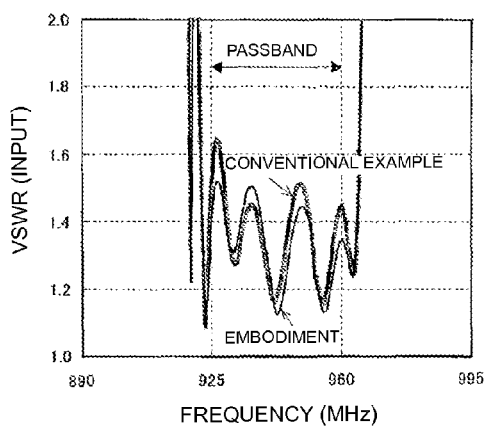
Figure 4C:
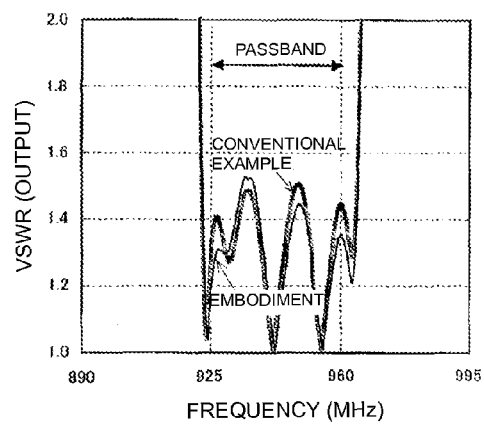

FIGS. 4A, 4B and 4C illustrate the characteristics of the surface acoustic wave filter according to the present preferred embodiment and the characteristics of a surface acoustic wave filter of a conventional example. Specifically, FIG. 4A illustrates an insertion loss, FIG. 4B illustrates the VSWR characteristics on the input side, and FIG. 4C illustrates the VSWR characteristics on the output side. In this case, the present preferred embodiment corresponds to the surface acoustic wave filter 350 having the specific design parameters described above. In FIGS. 4A-4C, the characteristics of the surface acoustic wave filter 350 are indicated by thin lines. As for the conventional example, the surface acoustic wave filter is basically the same as the surface acoustic wave filter 350 according to the present preferred embodiment except for the fact that the electrode fingers of the IDT 303 and the electrode fingers of the IDTs 302, 304 are arranged at the same pitch of 2.108 μm, and that the electrode fingers of the IDT 309 and the electrode fingers of the IDTs 308, 310 are arranged at the same pitch of 2.108 μm. In FIGS. 4A-4C, the characteristics of the surface acoustic wave filter of the conventional example are indicated by thick lines.

Comparing the VSWR characteristics between the two, it is apparent that the VSWR of the surface acoustic wave filter according to the present preferred embodiment is smaller (improved) in comparison to the VSWR of the surface acoustic wave filter of the conventional example with respect to most of the frequencies within the passband. In particular, the highest input side VSWR at a low frequency end portion of the passband according to the surface acoustic wave filter of the conventional example is reduced significantly in the surface acoustic wave filter according to the present preferred embodiment.

On the other hand, near the 935 MHz frequency range, the VSWR of the surface acoustic wave filter of the conventional example is lower than the VSWR of the surface acoustic wave filter according to the present preferred embodiment. This is due to the fact that the parasitic capacitance between the cascade connected wires and the grounding pattern near the 935 MHz frequency range acts in a direction for facilitating the impedance matching in the cascade connected portion. In contrast, the effect of this parasitic capacitance is disturbed in the present preferred embodiment, which resulted in the deterioration of the impedance matching in the cascade connected portion. Since the parasitic capacitance between the cascade connected wires and the grounding pattern facilitates the impedance matching in the cascade connected portion in a certain frequency range within the passband, the arrangement of the electrode fingers at smaller pitches does not necessarily mean that the VSWR characteristics are improved for all frequencies within the passband. However, the parasitic capacitance between the cascade connected wires and the grounding pattern is generally excessive, and is thus a factor for deteriorating the impedance matching in the cascade connected portion for most frequency ranges within the passband.

Accordingly, by arranging the electrode fingers at narrower pitches as in the above-described preferred embodiments, the VSWR can be reduced for a large portion of the passband, meaning that the VSWR characteristics are improved as a whole.

Since the effect of the parasitic capacitance between the cascade connected wires and the grounding pattern tend to become too intense in proportion to the increase in the relative dielectric constant of the piezoelectric substrate or the increase in the frequency in the passband, the arrangement of the electrode fingers at narrower pitches according to the present preferred embodiment is effective for improving the VSWR characteristics.

The present invention is not limited to the above described preferred embodiments, and modifications are permissible within the scope and spirit of the present invention.

While the present invention has been described with respect to preferred embodiments, it will be apparent to those skilled in the art that the disclosed invention may be modified in numerous ways and may assume many preferred embodiments other than those specifically set out and described above. Accordingly, it is intended by the appended claims to cover all modifications of the present invention which fall within the true spirit and scope of the invention.

The invention claimed is:

1. An elastic wave filter comprising:
   two longitudinally coupled resonator type elastic wave filter elements, each longitudinally coupled resonator type elastic wave filter element including three IDTs arranged on a piezoelectric substrate in a transmitting direction of an elastic wave; wherein
   two of the three IDTs of one longitudinally coupled resonator type elastic wave filter element are cascade connected to two of the three IDTs of the other longitudinally coupled resonator type elastic wave filter element;
   each respective IDT of the three IDTs includes a narrow pitch electrode finger portion at each end portion of the respective IDT that is disposed adjacent to a neighboring one of the three IDTs, the narrow pitch electrode finger portion having a pitch that is smaller than a pitch of a remaining portion of the respective IDT; and
   in at least one of the longitudinally coupled resonator type elastic wave filter elements, the electrode fingers disposed in the remaining portion of at least one of the IDTs that are cascade connected are arranged at a pitch that is smaller than a pitch of the electrode fingers disposed in the remaining portion of a remaining IDT that is not cascade connected, such that a frequency of a conductance peak in said at least one of the cascade connected IDTs is higher than a frequency of a conductance peak in the remaining IDT.

2. The elastic wave filter according to claim 1, wherein in each of the longitudinally coupled resonator type elastic wave filter elements, the electrode fingers of said one or two of the IDTs that are cascade connected are arranged at a pitch that is smaller than a pitch of the electrode fingers of the remaining IDT.

3. The elastic wave filter according to claim 1, wherein a relative dielectric constant of the piezoelectric substrate is about 30 or more.

4. The elastic wave filter according to claim 1, wherein the electrode fingers of the cascade connected IDTs are arranged at a pitch of about 2.108 μm.

5. The elastic wave filter according to claim 1, wherein a center frequency of a passband of the filter is about 500 MHz or more.

6. The elastic wave filter according to claim 1, wherein the elastic wave filter is a surface acoustic wave filter, wherein the IDTs are aligned in a transmitting direction of a surface acoustic wave.

7. The elastic wave filter according to claim 1, wherein the elastic wave filter is an elastic boundary wave filter, the elastic boundary wave filter further comprising a thin film disposed on the piezoelectric substrate, the thin film having an elastic constant or a density that is different from that of the piezoelectric substrate, wherein the IDTs are aligned in a transmitting direction of an elastic boundary wave between the piezoelectric substrate and the thin film.

8. A communication device comprising the elastic wave filter according to claim 1.

9. An elastic wave filter comprising:

two longitudinally coupled resonator type elastic wave filter elements, each longitudinally coupled resonator type elastic wave filter element including three IDTs arranged on a piezoelectric substrate in a transmitting direction of an elastic wave; wherein two IDTs of one longitudinally coupled resonator type elastic wave filter element are cascade connected to two IDTs of the other longitudinally coupled resonator type elastic wave filter element;

in at least one of the longitudinally coupled resonator type elastic wave filter elements, electrode fingers of one or two of the IDTs that are cascade connected are arranged at a pitch that is smaller than a pitch of electrode fingers of a remaining IDT that is not cascade connected, such that a frequency of a conductance peak in said one or two of the cascade connected IDTs is higher than a frequency of a conductance peak in the remaining IDT;

the electrode fingers of the cascade connected IDTs are arranged at a pitch of about 2.108 µm; and four of the electrode fingers of the cascade connected IDTs adjacent to the remaining IDT are arranged at a pitch of about 1.941 µm.

10. An elastic wave filter comprising:

two longitudinally coupled resonator type elastic wave filter elements, each longitudinally coupled resonator type elastic wave filter element including three IDTs arranged on a piezoelectric substrate in a transmitting direction of an elastic wave; wherein two IDTs of one longitudinally coupled resonator type elastic wave filter element are cascade connected to two IDTs of the other longitudinally coupled resonator type elastic wave filter element;

in at least one of the longitudinally coupled resonator type elastic wave filter elements, electrode fingers of one or two of the IDTs that are cascade connected are arranged at a pitch that is smaller than a pitch of electrode fingers of a remaining IDT that is not cascade connected, such that a frequency of a conductance peak in said one or two of the cascade connected IDTs is higher than a frequency of a conductance peak in the remaining IDT; and the pitches of the electrode fingers in the cascade connected IDTs are smaller than the pitches of the electrode fingers in the remaining IDT by a ratio within a range of about 0.995 to about 0.850.

* * * * *